(12) United States Patent
Hirai

(10) Patent No.: US 8,681,031 B2
(45) Date of Patent: Mar. 25, 2014

(54) D/A CONVERTER

(75) Inventor: Koji Hirai, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 206 days.

(21) Appl. No.: 13/397,608

(22) Filed: Feb. 15, 2012

(65) Prior Publication Data

US 2012/0139769 A1 Jun. 7, 2012

Related U.S. Application Data

(63) Continuation of application No. 12/801,457, filed on Jun. 9, 2010, now Pat. No. 8,144,044.

(30) Foreign Application Priority Data

Jul. 7, 2009 (JP) ................................. 2009-160736

(51) Int. Cl.
*H03M 1/66* (2006.01)

(52) U.S. Cl.
USPC ......................................... 341/145; 341/144

(58) Field of Classification Search
USPC ............. 341/144, 145, 136, 154; 345/98, 204
See application file for complete search history.

(56) References Cited

U.S. PATENT DOCUMENTS

| 5,856,797 A | 1/1999 | Kawauchi |
| 5,969,657 A * | 10/1999 | Dempsey et al. ............. 341/145 |
| 7,995,022 B2 | 8/2011 | Yoshioka et al. |
| 2007/0194965 A1 | 8/2007 | Kim et al. |
| 2008/0048935 A1 | 2/2008 | Yoshioka et al. |
| 2008/0316077 A1 | 12/2008 | Matsuo |

FOREIGN PATENT DOCUMENTS

| JP | 2007-228556 A | 9/2007 |
| JP | 2008-054016 A | 3/2008 |
| JP | 2008-85711 A | 4/2008 |

OTHER PUBLICATIONS

Japanese Notification of Reasons for Refusal dated Jun. 18, 2013, with partial English-language translation.

* cited by examiner

*Primary Examiner* — Joseph Lauture
(74) *Attorney, Agent, or Firm* — McGinn IP Law Group, PLLC

(57) ABSTRACT

A resistor string type D/A converter includes a higher-order decoder to which a digital signal is input, a higher-order resistor string in which a plurality of resistors and a plurality of voltage drawing points are alternately connected between a first reference voltage and a second reference voltage, the higher-order resistor string being configured to output a plurality of first voltages, each from a respective one of the plurality of voltage drawing points, a plurality of first higher-order switches connected to the plurality of voltage drawing points in a one-to-one configuration, conductive states of the first higher-order switches being controlled based on the digital signal, and a conversion unit that outputs a second voltage based on the plurality of the first voltages supplied through the plurality of first higher-order switches. The higher-order decoder brings two first higher-order switches into conduction based on the digital signal.

8 Claims, 5 Drawing Sheets

D/A CONVERTER

INCORPORATION BY REFERENCE

The present application is a Continuation Application of U.S. patent application Ser. No. 12/801,457, filed on Jun. 9, 2010, which is based on Japanese patent application No. 2009-160736, filed on Jul. 7, 2009; the disclosure of which is incorporated herein in its entirety by reference.

BACKGROUND

1. Field of the Invention

The present invention relates to a D/A converter, in particular a resistor string type D/A converter.

2. Description of Related Art

In recent years, high resolution in excess of 10 bits as well as high accuracy and cost reduction have been required in the field of D/A (Digital to Analog) converters.

In particular, resistor string type D/A converters employing a higher-order and lower-order division scheme and resistor string type D/A converters using an interpolation amplifiers are methods capable of realizing both high resolution and reduction in size simultaneously.

Japanese Unexamined Patent Application Publication No. 2008-85711 discloses a resistor string type D/A converter employing a higher-order and lower-order division scheme. FIG. 5 shows a configuration example of the resistor string type D/A converter employing a higher-order and lower-order division scheme disclosed in Japanese Unexamined Patent Application Publication No. 2008-85711. FIG. 5 shows a case where input data of 10 bits in width is divided into higher 8 bits and lower 2 bits.

In FIG. 5, two switches 51H and 51L for H (High) and L (Low) respectively are connected to respective voltage drawing points 502 at both ends of respective resistors 501 of the higher-order resistor string 50. Further, the lower 2-bit D/A converter 52 is composed of a resistor string 520 composed of four resistors 5202, and a selector 522. Further, the connection points 5201 between respective resistors 5202 and a signal line VL are connected to respective switches 521.

With the configuration like this, one of the switches 51L for Low and the switch 51H for High connected to the connection point 502 immediately higher than that switch 51L are turned on by the selector 53 based on higher 8 bit data, and a pair of voltages corresponding to the higher 8 bits are thereby supplied through the signal lines VH and VL. Then, one of the switches 521 is turned on by the selector 522, and a voltage that is specified by the lower 2 bits is thereby output. Therefore, an analog voltage according to a digital signal of 10-bits in width is output as a whole, and thus a 10-bit D/A conversion is performed.

SUMMARY

However, in the resistor string type D/A converter disclosed in Japanese Unexamined Patent Application Publication No. 2008-085711, since the switch 51H for High and the switch 51L for Low are connected to each voltage drawing point 502 of the higher-order resistor string 50, two switches are provided between each pair of the resistors 501.

Accordingly, since two switches are connected to each of 256 resistors 501, 512 (256×2) switches need to be provided in the case of a higher 8-bit D/A converter. Therefore, there is a problem that the chip size of the D/A converter becomes larger.

A first exemplary aspect of the present invention is a resistor string type D/A converter including: a higher-order resistor string that generates a plurality of higher-order analog voltages by dividing a voltage between a first reference voltage and a second reference voltage and outputs the plurality of higher-order analog voltages from a plurality of voltage drawing points; first higher-order switches each provided for a respective one of the plurality of voltage drawing points, a conductive state of the first higher-order switches being controlled based on a first higher-order control signal; a higher-order decoder that generates the first higher-order control signal according to a value of a higher-order bit of a digital signal and brings a pair of first higher-order switches corresponding to neighboring higher-order analog voltages among the first higher-order switches into conduction based on the first higher-order control signal, the digital signal indicating one value by a plurality of bits; a lower-order decoder that generates a lower-order control signal corresponding to a value of a lower-order bit of the digital signal; and a conversion unit that outputs a voltage between a pair of analog voltage values obtained through the pair of first higher-order switches based on the lower-order control signal.

A resistor string type D/A converter in accordance with an exemplary aspect of the present invention does not need to be provided with two or more switches for each of the higher-order analog voltages, and thereby can reduce the number of switches, thus enabling the chip size to be reduced.

The present invention, in an exemplary aspect, can provide a D/A converter having a reduced chip size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
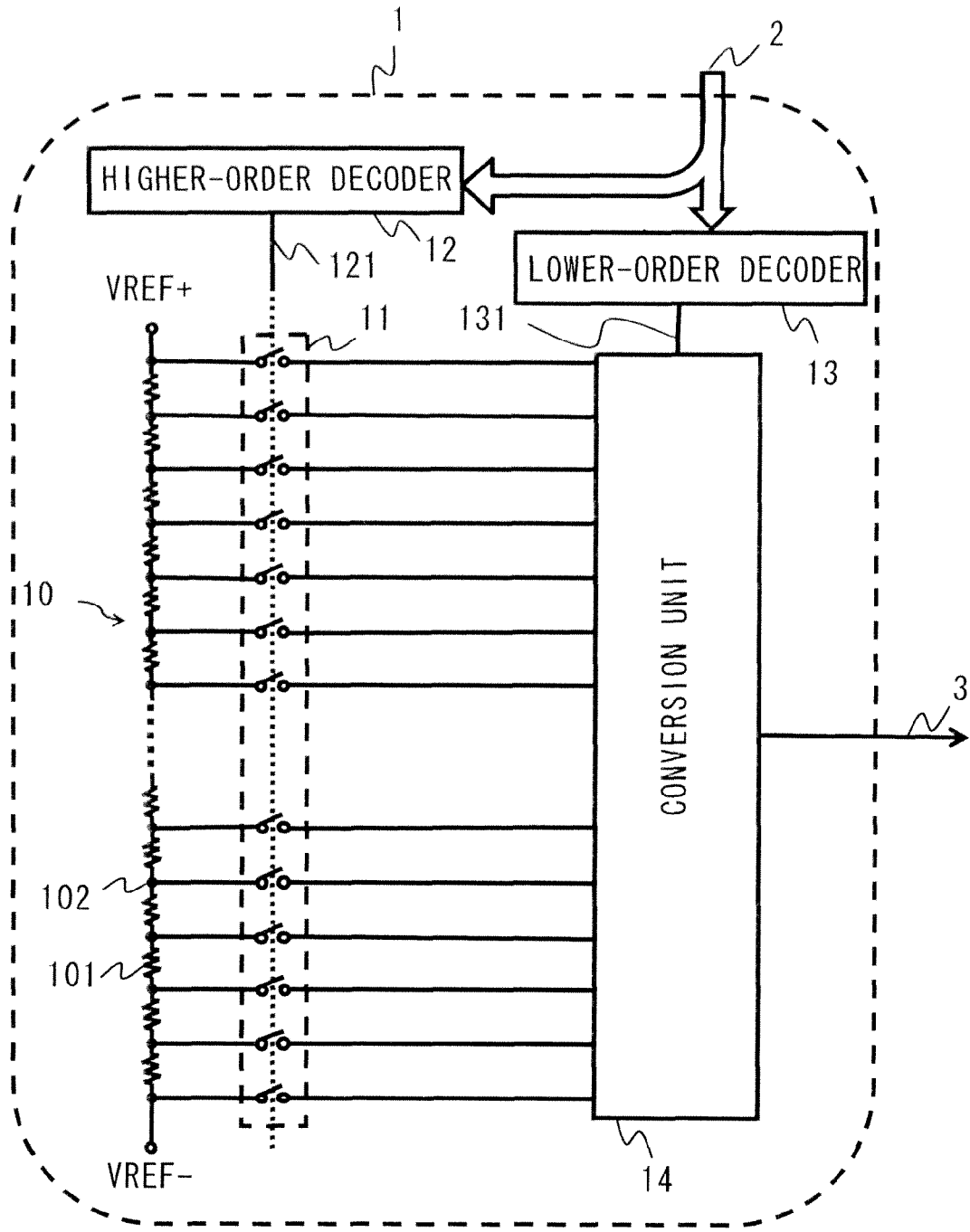
FIG. 1 shows a configuration example of a resistor string type D/A converter in accordance with a first exemplary embodiment of the present invention.

A first exemplary embodiment in accordance with the present invention is explained hereinafter with reference to FIG. 1. FIG. 1 shows a configuration example of a resistor string type D/A converter in accordance with an exemplary aspect of the present invention. The D/A converter 1 includes a higher-order resistor string 10, first higher-order switches 11, a higher-order decoder 12, a lower-order decoder 13, and a conversion unit 14.

The higher-order resistor string 10 divides the voltage between a first reference voltage (e.g., high-potential-side reference voltage VREF+) and a second reference voltage (e.g., low-potential-side reference voltage VREF−) to generate and output a plurality of higher-order analog voltages. In FIG. 1, the higher-order resistor string 10, which includes a plurality of higher-order resistors 101 and a plurality of voltage drawing points 102, generates a plurality of higher-order analog voltages divided by the plurality of higher-order resistors 101 connected in series. The voltage drawing points 102 are provided between respective neighboring pairs of the higher-order resistors 101, and at the highest-order and lowest-order parts of the higher-order resistors 101. Further, the divided analog voltages are output from these voltage drawing points 102.

Each of the first higher-order switches 11 is provided for a respective one of the plurality of voltage drawing points 102 provided in the higher-order resistor string 10. The conductive states of these first higher-order switches 11 are controlled by a first higher-order control signal 121 output from the higher-order decoder 12. One terminal of each of the first higher-order switches 11 is connected to a corresponding one of the voltage drawing points 102, and the other terminal is connected to the conversion unit 14.

The higher-order decoder 12 decodes a value of higher bits of a digital input signal 2 to generate a first higher-order control signal 121. The number of the higher bits is arbitrarily determined. Further, the higher-order decoder 12 brings a pair of first higher-order switches 11 corresponding to neighboring higher-order analog voltages among the first higher-order switches into conduction by using the generated first higher-order control signal 121. In this exemplary embodiment, the digital input signal 2 represents one value by a plurality of bits. The pair of analog voltage values that are obtained through the pair of first higher-order switches 11 selected by the first higher-order control signal 121 are supplied to the conversion unit 14 disposed at the subsequent stage.

The lower-order decoder 13 decodes a value of lower bits of the digital input signal 2 to generate a lower-order control signal 131 corresponding to that value. This value on the lower-bit side is lower-bit data composed of bits on the lower-order side of the digital input signal 2 and may include a higher-order bit(s). The lower-order decoder 13 outputs the generated lower-order control signal 131 to the conversion unit 14.

The conversion unit 14 converts a pair of analog voltage values supplied from the higher-order resistor string 10 into one voltage between the pair of analog voltages based on the lower-order control signal 131, and outputs the converted voltage as one analog output signal 3 corresponding to the digital input signal 2.

For example, assuming that the digital input signal 2 is data having a 10-bit width and the higher bits and the lower bits are defined as higher 8 bits and lower 2 bits respectively, the higher 8-bit data is supplied to the higher-order decoder 12 and the lower 2-bit data is supplied to the lower-order decoder 13. Note that the higher bits are eight bits. Therefore, the higher-order resistor string 10 includes 256 higher-order resistors 101 to divide the voltage between the high-potential-side reference voltage VREF+ and the low-potential-side reference voltage VREF− into 256 voltages.

As a result, the higher-order resistor string 10 is provided with 257 voltage drawing points 102, and the number of the first higher-order switches 11 connected to the voltage drawing points 102 is also 257. Therefore, the number of switches in the D/A converter in accordance with an exemplary aspect of the present invention is almost half of that of the related art, which requires 512 switches.

As described above, only one first higher-order switch 11 is connected to each of the voltage drawing points 102 in the first exemplary embodiment in accordance with the present invention. Therefore, the number of the switches can be almost halved compared to the related art, thus enabling the chip size of the D/A converter to be reduced.

Second Exemplary Embodiment

Figure 2:
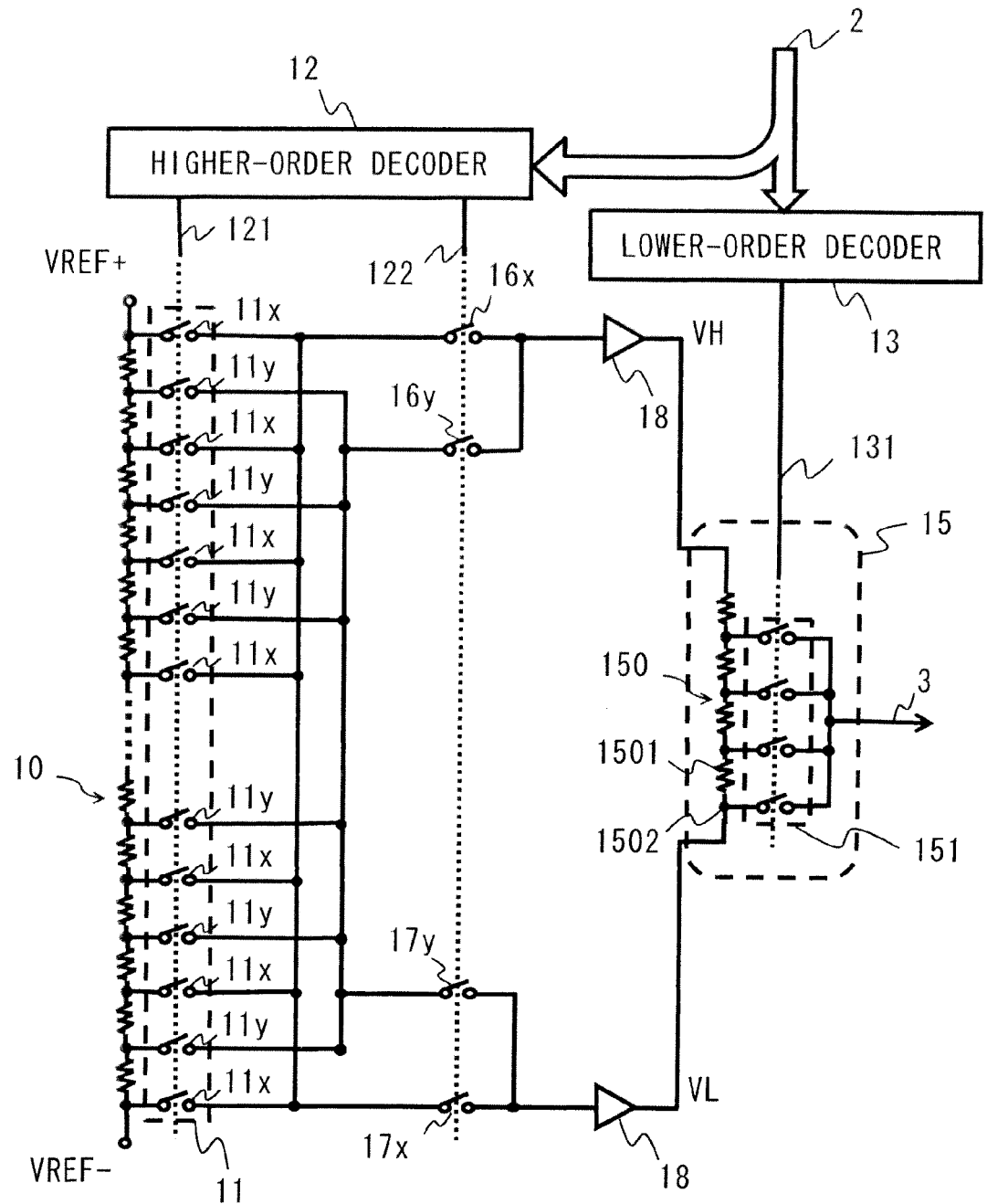
FIG. 2 shows a configuration example of a resistor string type D/A converter in accordance with a second exemplary embodiment of the present invention.

Next, a second exemplary embodiment in accordance with the present invention is explained hereinafter with reference to FIG. 2. FIG. 2 shows a configuration example of a resistor string type D/A converter in accordance with the second exemplary embodiment of the present invention. The resistor string type D/A converter shown in FIG. 2 includes a higher-order resistor string 10, first higher-order switches 11, a higher-order decoder 12, a lower-order decoder 13, a lower-order resistor string type D/A converter 15, second higher-order switches 16x, 16y, 17x and 17y, and a buffer 18. Referring to FIG. 2, a resistor string type D/A converter is explained, as an example, on the assumption that the digital input signal 2 has 10 bits and the higher bits and the lower bits are composed of 8 bits and 2 bits respectively. The higher-order resistor string 10 has a similar configuration to that of the first exemplary embodiment, and therefore its explanation is omitted.

The connection relation between the first higher-order switches 11 and the second higher-order switches 16x, 16y, 17x and 17y is explained hereinafter. In FIG. 2, among the first higher-order switches 11, the switches 11x, which are connected to voltage drawing points 102 corresponding to a situation where the value of the higher 8-bit data of the digital input signal 2 is expressed as 2n (n is an integer equal to or larger than 0), are connected to the second higher-order switches 16x and 17x. Meanwhile, the switches 11y, which are connected to voltage drawing points 102 corresponding to a situation where the value of the higher 8-bit data is expressed as 2n+1, are connected to the second higher-order switches 16y and 17y.

The lower-order resistor string type D/A converter 15 includes a lower-order resistor string 150 and lower-order switches 151. Further, the lower-order resistor string 150 has a plurality of lower-order resistors 1501 and a plurality of voltage drawing points 1502. Further, the highest-order side of the lower-order resistor string 150 is connected to a high-potential-side signal line VH and the lowest-order side is connected to a low-potential-side signal line VL. To differentiate between the voltage drawing points 102 of the higher-order resistor string 10 and the voltage drawing points 1502 of the lower-order resistor string 150, the voltage drawing points of the lower-order resistor string 150 are referred to as "lower-order voltage drawing points 1502" in the following explanation. A pair of analog voltages output from the higher-order resistor string 10 are supplied to the low-potential-side signal line VL and the high-potential-side signal line VH through the second higher-order switches 16x, 16y, 17x and 17y.

Next, an example of an operation of the resistor string type D/A converter shown in FIG. 2 is explained hereinafter. Firstly, the higher 8-bit data of a digital input signal 2 is input to the higher-order decoder 12 and the lower-order 2-bit data is input to the lower-order decoder 13. Assuming that the value of the digital input signal 2 is expressed as 4n to 4n+3, the higher-order decoder 12 outputs a first higher-order control signal 121 that turns on the first higher-order switches 11x and 11y connected to the nth and (n+1)th voltage drawing points 102 (counted from the lowest-order of the higher-order resistor string 10) so that a pair of analog voltages are output from the nth and (n+1)th voltage drawing points 102.

Next, the higher-order decoder 12 outputs a second higher-order control signal 122 to control the second higher-order switches 16x, 16y, 17x and 17y based on the digital input signal 2. If the value of the digital input signal 2 is expressed as 8m to 8m+3 (m is an integer equal to or larger than 0), the voltage applied to the turned-on first higher-order switch 11y becomes higher than the voltage applied to the turned-on first higher-order switch 11x. Therefore, in this case, the turned-on first higher-order switch 11x is connected to the low-potential-side signal line VL and the turned-on first higher-order switch 11y is connected to the high-potential-side signal line VH. Therefore, the higher-order decoder 12 outputs the second control signal 122 and thereby turns on the second higher-order switches 17x and 16y.

Further, if the value of the digital input signal 2 is expressed as 8m+4 to 8m+7, the voltage applied to the turned-on first higher-order switch 11y becomes lower than the voltage applied to the turned-on first higher-order switch 11x. Therefore, in this case, the turned-on first higher-order switch 11y is connected to the low-potential-side signal line VL and the turned-on first higher-order switch 11x is connected to the high-potential-side signal line VH. Therefore, the higher-order decoder 12 outputs the second control signal 122 and thereby turns on the second higher-order switches 16x and 17y.

With the operation explained above, the higher one of the pair of analog voltages output from the higher-order resistor string 10 is supplied to the highest-order of the lower-order resistor string 150 and the lower one is supplied to the lowest-order of the lower-order resistor string 150. Note that in this exemplary embodiment, each of the low-potential-side signal line VL and the high-potential-side signal line VH is equipped with the buffer 18 to lower the impedance.

The lower-order resistor string type D/A converter 15 generates four analog voltages by dividing the analog voltage between the high-potential-side signal line VH and the low-potential-side signal line VL. Further, the lower-order decoder 13 turns on one of the lower-order switches 151 based on the decoding result of the lower 2-bit data. In this way, one of the divided four analog voltages is output as an analog output signal 3 corresponding to the digital input signal 2.

As has been described above, the resistor string type D/A converter in accordance with the second exemplary embodiment is provided with the second higher-order switches 16x, 16y, 17x and 17y. Therefore, even though the number of the first higher-order switches 11 connected to the higher-order resistor string 10 is half of the related art, it is possible to realize a higher-order and lower-order division type resistor string type D/A converter. As a result, it is possible to reduce the chip size.

Third Exemplary Embodiment

Figure 3:
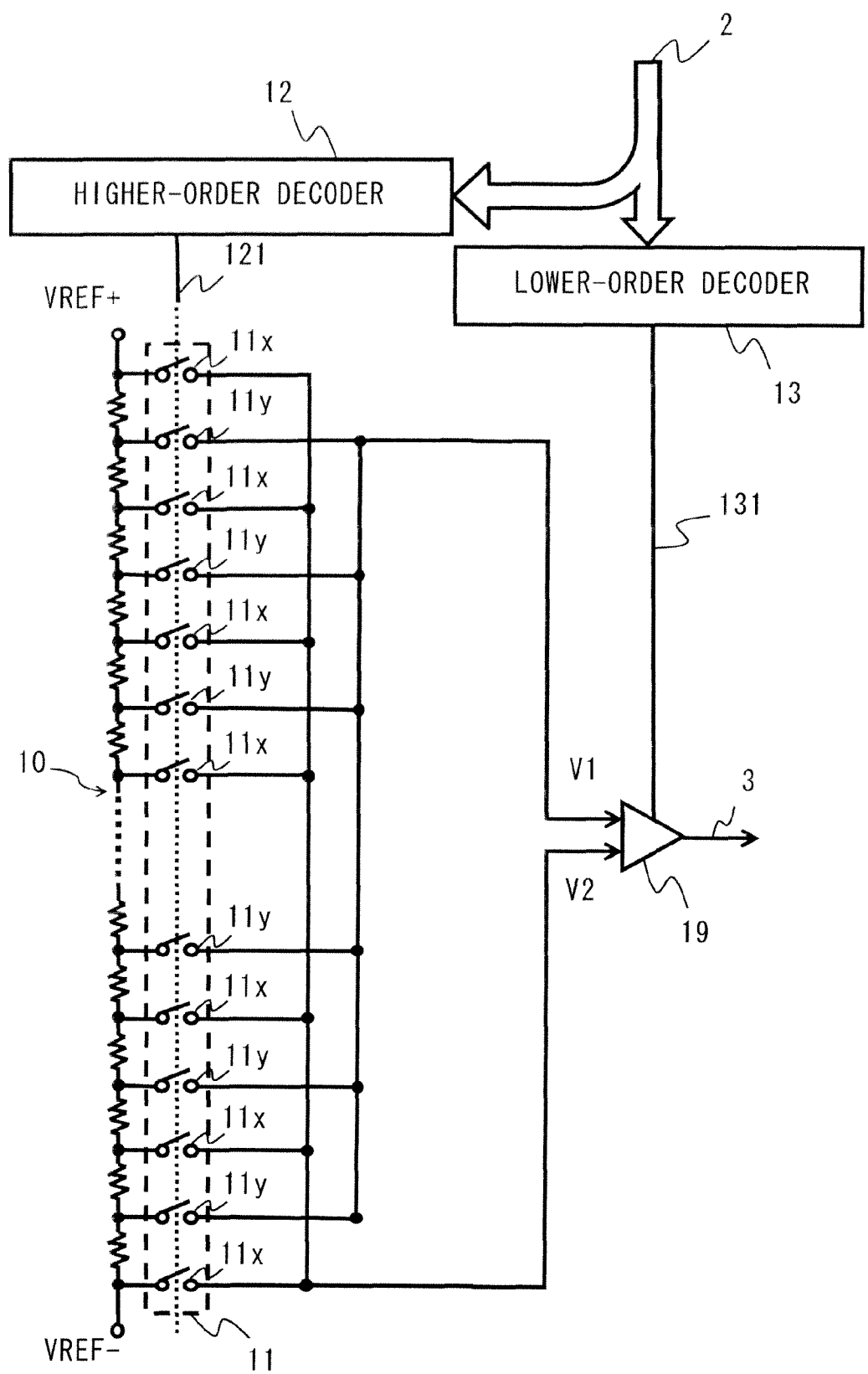
FIG. 3 shows a configuration example of a resistor string type D/A converter in accordance with a third exemplary embodiment of the present invention.

In a third exemplary embodiment of the present invention, a resistor string type D/A converter using an interpolation amplifier as the conversion unit 14 shown in FIG. 1 is explained. FIG. 3 shows a configuration example of a resistor string type D/A converter in accordance with the third exemplary embodiment of the present invention. The D/A converter shown in FIG. 3 includes a higher-order resistor string 10, first higher-order switches 11, a higher-order decoder 12, a lower-order decoder 13, and an interpolation amplifier 19. Note that in this exemplary embodiment, an example where a D/A conversion is performed by dividing a digital input signal 2 having 10 bits into higher 8 bits and lower 3 bits is explained. Further, the lowest-order bit of the higher 8 bits and the highest-order bit of the lower 3 bits are duplicated and input to both the higher-order decoder 12 and the lower-order decoder 13. The higher-order resistor string 10 has a similar configuration to that of the first exemplary embodiment, and therefore its explanation is omitted.

Further, the first higher-order switches 11x are connected to one end of a signal line V2, and the first higher-order switches 11y are connected to one end of a signal line V1. The other ends of the signal lines V1 and V2 are connected to the interpolation amplifier 19.

An example of an operation of the resistor string type D/A converter shown in FIG. 3 is explained hereinafter. The operation of the first higher-order switches 11 and the higher-order decoder in which a pair of analog voltages are drawn out from the higher-order resistor string 10 is similar to that of the second exemplary embodiment. That is, assuming that the value of the digital input signal 2 is expressed as 4n to 4n+3, the higher-order decoder 12 outputs the first higher-order control signal 121 that turns on the first higher-order switches 11x and 11y connected to the nth and (n+1)th voltage drawing points 102 (counted from the lowest-order of the higher-order resistor string 10).

However, the resistor string type D/A converter shown in FIG. 3 does not have the second higher-order switches 16x, 16y, 17x and 17y shown in FIG. 2. Therefore, an analog voltage output from the first higher-order switch 11x is always supplied to the signal line V2 regardless of the relation in magnitude with the analog voltage output from the first higher-order switch 11y. Similarly, an analog voltage output from the first higher-order switch 11y is always supplied to the signal line V1. Therefore, a pair of analog voltages for which the relation in magnitude is not specified are input to the interpolation amplifier 19 through the signal lines V1 and V2.

An example of an operation of the interpolation amplifier 19 is explained hereinafter. The interpolation amplifier 19 determines the relation in magnitude between the signal lines V1 and V2 by using the highest-order bit of the lower 3 bits, which is also used as the lowest-order bit of the higher 8 bits. Further, the voltage between the pair of input analog signals is divided by using the remaining 2 bits, i.e., bits other than the highest-order bit, of the lower 3 bits.

If the value of the digital input signal 2 is expressed as 8m, the relation is expressed as "voltage value of signal line V1>voltage value of signal line V2" in the interpolation amplifier 19. In this case, a voltage equal to the signal line V2 is output as an analog output signal 3.

If the value of the digital input signal 2 is expressed as 8m+1, the relation is expressed as "voltage value of signal line V1>voltage value of signal line V2". In this case, the interpolation amplifier 19 generates a voltage expressed as "((voltage value of V1)+3×(voltage value of V2))/4" (¼ interpolation) and outputs the generated voltage as the analog output signal 3.

If the value of the digital input signal 2 is expressed as 8m+2 or 8m+6, the interpolation amplifier 19 generates a voltage equal to the half of the sum of the two input voltages (½ interpolation) and outputs the generated voltage as the analog output signal 3.

If the value of the digital input signal 2 is expressed as 8m+3, the relation is expressed as "voltage value of signal line V1>voltage value of signal line V2". In this case, the interpolation amplifier 19 generates a voltage expressed as "(3×(voltage value of V1)+(voltage value of V2))/4" (¾ interpolation) and outputs the generated voltage as the analog output signal 3.

If the value of the digital input signal 2 is expressed as 8m+4, the relation is expressed as "voltage value of signal line V1<voltage value of signal line V2" in the interpolation amplifier 19. In this case, a voltage equal to the signal line V1 is output as the analog output signal 3 to obtain a desired voltage.

If the value of the digital input signal 2 is expressed as 8m+5, the relation is expressed as "voltage value of signal line V1<voltage value of signal line V2". In this case, the interpolation amplifier 19 generates a voltage expressed as "(3×(voltage value of V1)+(voltage value of V2))/4" (¾ interpolation) and outputs the generated voltage as the analog output signal 3.

If the value of the digital input 2 is expressed as 8m+7, the relation is expressed as "voltage value of signal line V1<voltage value of signal line V2". The interpolation amplifier 19 generates a voltage expressed as "((voltage value of V1)+3×(voltage value of V2))/4" (¼ interpolation) and outputs the generated voltage as the analog output signal 3.

As explained above, the interpolation amplifier 19 divides the voltage between a pair of analog voltages based on the lower-order control signal 131, which is output according to the value of the digital input signal 2 from the lower-order decoder 13, and outputs one analog output signal 3 corresponding to that digital input signal 2.

By using a resistor string type D/A converter like this, a D/A conversion can be performed without requiring the second higher-order switches 16x, 16y, 17x and 17y used in the second exemplary embodiment. Therefore, the number of switches can be reduced even further.

Fourth Exemplary Embodiment

The resistors are arranged in a straight line in the higher-order resistor string 10 in the first to third exemplary embodiments. In contrast to this, in a fourth exemplary embodiment, a resistor string type D/A converter including a higher-order resistor string 10 in which resistors are arranged in a line that is folded into multiple stages is explained. In the fourth exemplary embodiment, an example where a D/A conversion is performed by dividing a digital input signal 2 having 7 bits into higher-order 5 bits and lower 3 bits is explained. Note that similarly to the third exemplary embodiment, the lowest-order bit of the higher bits and the highest-order bit of the lower bits is duplicated.

Figure 4:
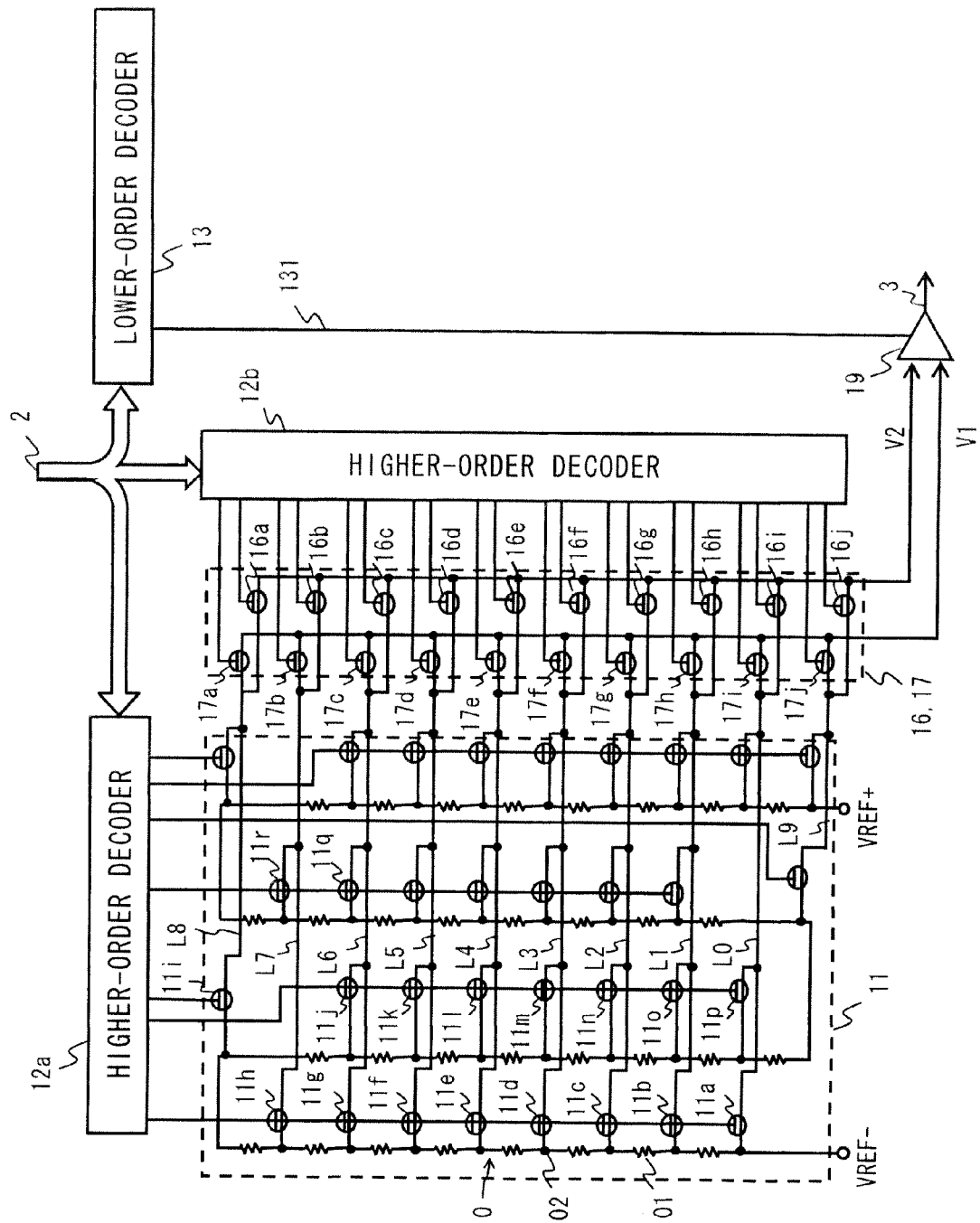
FIG. 4 shows a configuration example of a resistor string type D/A converter in accordance with a fourth exemplary embodiment of the present invention.
Figure 5:
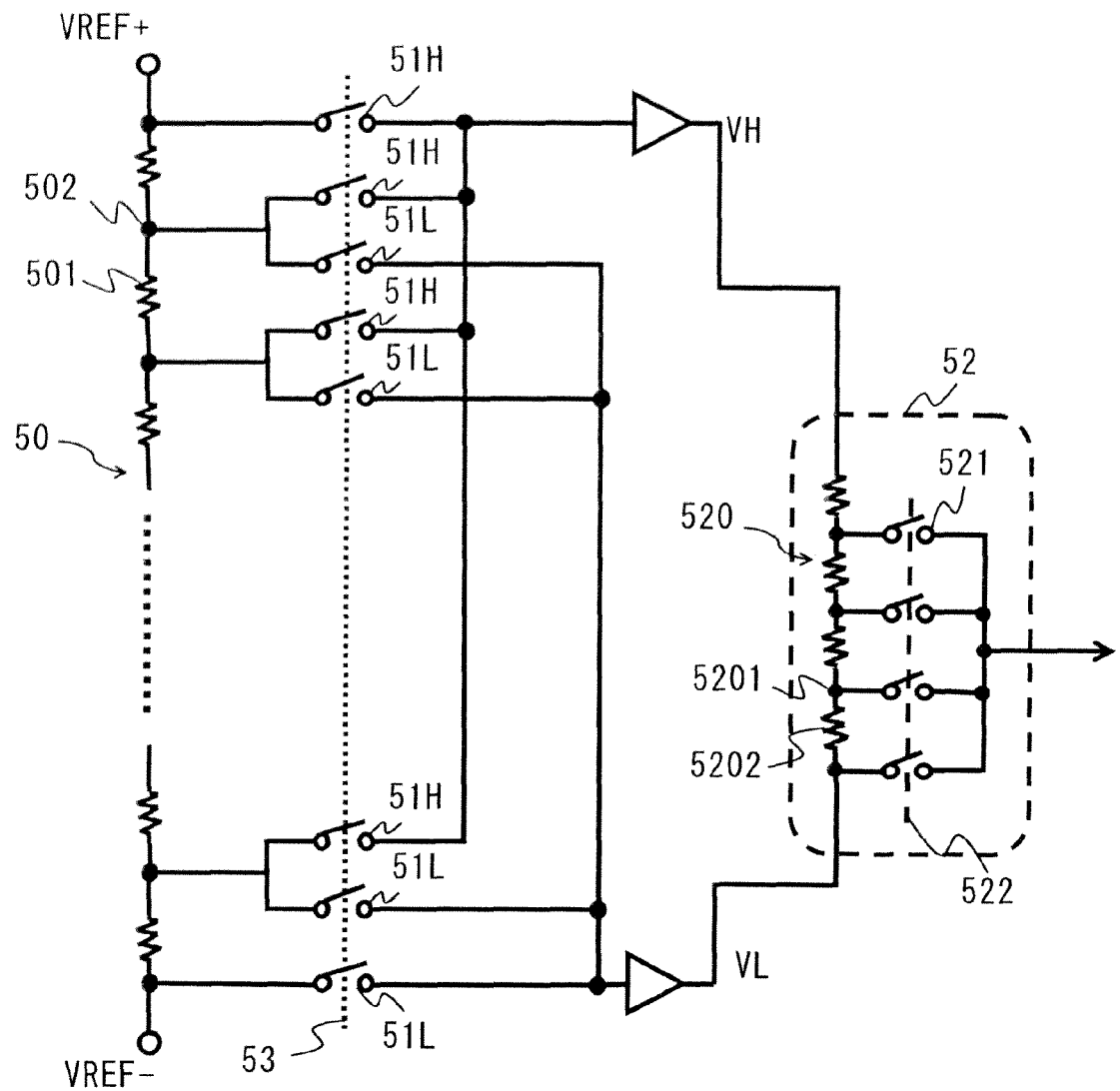
FIG. 5 shows a configuration example of a resistor string type D/A converter in accordance with in related art.

FIG. 4 shows a configuration example of a resistor string type D/A converter in which the higher-order resistor string 10 is folded into four stages. Note that through an example where the higher-order resistor string 10 is folded into four stages is explained in this exemplary embodiment, the number of folded stages is not limited to four.

The D/A converter shown in FIG. 4 includes a higher-order resistor string 10, first higher-order switches 11, higher-order decoders 12a and 12b, a lower-order decoder 13, second higher-order switches 16 and 17, and an interpolation amplifier 19. The higher-order resistor string 10 includes a plurality of voltage drawing points. Further, a first higher-order switch is connected to each of the voltage drawing points. Furthermore, the higher-order resistor string 10 is disposed in a folded state. In an example shown in FIG. 4, the higher-order resistor string 10 is folded into four stages. Further, eight first higher-order switches are connected in each of the lower-order-side folded stages among the folded stages. Meanwhile, nine first higher-order switches are connected in the highest-order folded stage (the stage closest to the high-potential-side reference voltage VREF+) among the folded stages.

A plurality of signal lines L0 to L9 are arranged in a direction perpendicular to the direction along which the resistors of the higher-order resistor string 10 are connected in series. Further, in each of the signal lines, a first voltage drawing point and a second voltage drawing point are connected. The first voltage point is one voltage drawing point 102 among a plurality of voltage drawing points connected to one signal line. The second voltage point is a voltage drawing point corresponding to a resistor that is adjacent to the resistor corresponding to the first voltage drawing point in the longitudinal direction of the signal lines L0 to L9. Note that the second voltage drawing point does not include any voltage drawing point 102 that is adjacent to the first voltage drawing point in the direction along which the resistors of the higher-order resistor string 10 are connected in series.

For example, in the resistor string type D/A converter shown in FIG. 4, if the voltage drawing point 102 connected to the first higher-order switch 11f is defined as a first voltage drawing point, the second voltage drawing point is the voltage drawing point 102 connected to the first higher-order switch 11k. Further, if the voltage drawing point 102 connected to the first higher-order switch 11j is defined as a first voltage drawing point, the second voltage drawing point is the voltage drawing point 102 connected to the first higher-order switch 11g or 11q. However, the second voltage drawing point does not include the voltage drawing point 102 that is adjacent in the direction of the resistor string of the higher-order resistor string 10. Therefore, if the voltage drawing point 102 connected to the first higher-order switch 11h is defined as a first voltage drawing point, the second voltage drawing point is not the voltage drawing point 102 connected to the first higher-order switch 11i but is the voltage drawing point 102 connected to the first higher-order switch 11r.

Further, each of the signal lines L0 to L9 is connected to one ends of the second higher-order switches 16 and 17, and the other ends of the higher-order switches 16 and 17 are connected to the signal lines V2 and V1 respectively, which are connected to the interpolation amplifier 19.

The higher-order decoder 12a controls the first higher-order switches 11 based on the higher-order 5-bit data of the digital input signal 2. Note that although the first higher-order switches 11 adjacent to the folded portions are individually controlled, the remaining first higher-order switches 11 are collectively controlled in units of each straight portion of the folded higher-order resistor string 10. For example, the first higher-order switches 11a to 11h in FIG. 4 are collectively controlled.

The higher-order decoder 12b controls the second higher-order switches 16 and 17 based on the higher-order 5-bit data of the digital input signal 2. The higher-order decoder 12b turns on one of the second higher-order switches 17 to supply one of the pair of analog voltages, which are supplied through the signal lines L0 to L9 based on the above-described control of the first higher-order switches 11 by the higher-order decoder 12a, to the signal line V1, and turns on one of the second higher-order switches 16 to supply the other of the pair of analog voltages to the signal line V2.

The interpolation amplifier 19, which operates in a similar manner to that of the third exemplary embodiment, divides the voltage between the pair of analog voltages based on the lower-order control signal 131, which is output from the lower-order decoder 13 according to the value of the digital input signal 2. Further, the interpolation amplifier 19 outputs one analog output signal 3 corresponding to that digital input signal 2.

Next, a specific example of an operation of the resistor string type D/A converter shown in FIG. 4 is explained hereinafter. As a specific operation, a case where a voltage around a folded portion of the higher-order resistor string 10 is selected, i.e., a case where the range of the value of the digital input signal 2 is from 24 to 35 is explained hereinafter. The following explanation is made on condition that "VREF= (high-potential-side reference voltage VREF+)−(low potential-side reference voltage VREF−)" and "low-potential-side reference voltage VREF−0V".

Firstly, when the value of the digital input signal 2 is 24 to 27, the higher-order decoder 12a turns on the first higher-order switches 11a to 11h, and the higher-order decoder 12b turns on the second higher-order switches 17c and 16b. Since the second higher-order switch 17c is connected to the first higher-order switch 11g, the voltage value at the voltage drawing point 102 of the higher-order resistor string 10 connected to the first higher-order switch 11g, i.e., voltage value of $6/32$ VREF is output to the signal line V1. Similarly, the voltage value at the voltage drawing point 102 of the higher-order resistor string 10 connected to the first higher-order switch 11h, i.e., voltage value of $7/32$ VREF is output to the signal line V2.

When the value of the digital input signal 2 is 28 to 31, the higher-order decoder 12a turns on the first higher-order switches 11a to 11h and 11i, and the higher-order decoder 12b turns on the second higher-order switches 17b and 16b. A voltage value of $7/32$ VREF is output to the signal line V1, and a voltage value of $8/32$ VREF is output to the signal line V2.

When the value of the digital input signal 2 is 32 to 35, the higher-order decoder 12a turns on the first higher-order switches 11i and 11j to 11p, and the higher-order decoder 12b turns on the second higher-order switches 17a and 16c. A voltage value of $8/32$ VREF is output to the signal line V1, and a voltage value of $9/32$ VREF is output to the signal line V2.

When the value of the digital input signal 2 is 36 to 39, the higher-order decoder 12a turns on the first higher-order switches 11j to 11p, and the higher-order decoder 12b turns on the second higher-order switches 17c and 16d. A voltage value of $9/32$ VREF is output to the signal line V1, and a voltage value of $10/32$ VREF is output to the signal line V2.

The higher-order decoder 12a controls the first higher-order switches 11 such that more than one turned-on first higher-order switch 11 is not simultaneously connected to any one of the signal lines L0 to L9. As has been explained so far, in FIG. 4, for all the values of the digital input signal 2, the relation is expressed as "voltage value of signal line V1<voltage value of signal line V2".

The interpolation amplifier 19 determines the relation in magnitude between a pair of analog voltages supplied through the signal lines V1 and V2 by using the highest-order bit of the lower bits, and divides the voltage between the pair of analog voltages based on the lower-order control signal 131 supplied from the lower-order decoder 13. A specific example of an operation of the interpolation amplifier 19 is explained hereinafter.

When the digital input signal 2 is expressed as 4n, the interpolation amplifier 19 outputs a voltage equal to the signal line V1 as an analog output signal 3 to obtain a desired voltage.

When the digital input signal 2 is expressed as 4n+1, the interpolation amplifier 19 generates a voltage expressed as "(3×(voltage value of V1)+(voltage value of V2))/4" (¼ interpolation) and outputs the generated voltage as the analog output signal 3 to obtain a desired voltage.

Further, when the digital input signal 2 expressed as 4n+2 is converted, the interpolation amplifier 19 generates a voltage equal to the half of the sum of the signal lines V1 and V2 (½ interpolation) and outputs the generated voltage as the analog output signal 3 to obtain a desired voltage.

Furthermore, when the digital input signal 2 expressed as 4n+3 is converted, the interpolation amplifier 19 generates a voltage expressed as "((voltage value of V1)+3×(voltage value of V2))/4" (¾ interpolation) and outputs the generated voltage as the analog output signal 3 to obtain a desired voltage.

As described above, according to the resistor string type D/A converter in accordance with the fourth exemplary embodiment, the number of switches can be almost halved compared to the related art even when the higher-order resistor string 10 is folded into multiple stages.

Note that the present invention is not limited to the bit width of the digital input signal 2 like the ones explained above with the first to fourth exemplary embodiments. That is, the present invention is applicable to any given bit width by modifying the configuration of the higher-order resistor string 10. Further, the way of dividing bits into higher bits and lower bits is also not limited to those explained above with the first to fourth exemplary embodiments. That is, the present invention is applicable to bit divisions of any given bit number.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A resistor string type D/A converter comprising:
   a higher-order decoder to which a digital signal is input;
   a higher-order resistor string in which a plurality of resistors and a plurality of voltage drawing points are alternately connected between a first reference voltage and a second reference voltage, the higher-order resistor string being configured to output a plurality of first voltages, each from a respective one of the plurality of voltage drawing points;
   a plurality of first higher-order switches connected to the plurality of voltage drawing points in a one-to-one configuration, conductive states of the first higher-order switches being controlled based on the digital signal; and
   a conversion unit that outputs a second voltage based on the plurality of the first voltages supplied through the plurality of first higher-order switches, wherein
   the higher-order decoder brings two first higher-order switches, among the plurality of first higher-order switches, into conduction based on the digital signal.

2. The resistor string type D/A converter according to claim 1, further comprising a lower-order decoder, wherein
   a higher-order bit of the digital signal is input to the higher-order decoder,
   a lower-order bit of the digital signal is input to the lower-order decoder, and
   the conversion unit determines the second voltage based on an instruction from the lower-order decoder.

3. The resistor string type D/A converter according to claim 2, wherein a number of the higher-order bit is greater than a number of the lower-order bit.

4. The resistor string type D/A converter according to claim 2, wherein the conversion unit comprises a lower-order resistor string type D/A converter comprising:
- a lower-order resistor string that generates a plurality of lower-order voltages obtained by dividing the plurality of first voltages supplied through the plurality of first higher-order switches, and outputs the plurality of lower-order voltages from a plurality of lower-order voltage drawing points; and
- lower-order switches, each provided for a respective one of the plurality of lower-order voltage drawing points, conductive states of the lower-order switches being controlled based on a lower-order control signal, the lower-order control signal being output from the lower-order decoder according to a value of the lower-order bit.

5. The resistor string type D/A converter according to claim 2, wherein the conversion unit comprises an interpolation amplifier that outputs the second voltage obtained by dividing the plurality of first voltages supplied through the plurality of first higher-order switches based on a lower-order control signal, the lower-order control signal being output from the lower-order decoder according to a value of the lower-order bit.

6. The resistor string type D/A converter according to claim 2, further comprising a second higher-order switch, wherein
- the higher-order decoder outputs a second higher-order control signal according to a value of the higher-order bit, and
- the second higher-order switch selects the voltage based on the second higher-order control signal.

7. The resistor string type D/A converter according to claim 6, wherein when the higher-order resistor string is folded into a plurality of stages,
- the resistor string type D/A converter further comprises a plurality of signal lines connecting a first voltage drawing point to a second voltage drawing point, the second voltage drawing point being one of voltage drawing points that are adjacent to the first voltage drawing point in a direction perpendicular to a direction of a resistor string of the higher-order resistor string and do not include a voltage drawing point adjacent to that voltage drawing point in a direction of the resistor string of the higher-order resistor string, and
- the second higher-order switch selects the first voltage output through the plurality of signal lines, and supplies the selected first voltage to the conversion unit.

8. The resistor string type D/A converter according to claim 1, wherein the higher-order decoder brings two first higher-order switches, each of which is connected to a respective one of two voltage drawing points connected across a given resistor, among the plurality of first higher-order switches, into conduction based on the digital signal.

* * * * *